United States Patent
Wang et al.

(10) Patent No.: US 11,576,269 B2
(45) Date of Patent: Feb. 7, 2023

(54) BACK FILM STRUCTURE, MANUFACTURING METHOD THEREOF, DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Yanxin Wang, Beijing (CN); Liqiang Chen, Beijing (CN); Xu Tang, Beijing (CN); Dongdong Zhao, Beijing (CN); Yaming Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 124 days.

(21) Appl. No.: 17/254,969

(22) PCT Filed: Jun. 24, 2020

(86) PCT No.: PCT/CN2020/097961
§ 371 (c)(1),
(2) Date: Dec. 22, 2020

(87) PCT Pub. No.: WO2021/000772
PCT Pub. Date: Jan. 7, 2021

(65) Prior Publication Data
US 2021/0204417 A1    Jul. 1, 2021

(30) Foreign Application Priority Data
Jul. 2, 2019 (CN) .......................... 201910591398.3

(51) Int. Cl.
*H05K 7/02* (2006.01)
*H05K 7/04* (2006.01)
*H05K 5/00* (2006.01)

(52) U.S. Cl.
CPC .................................. *H05K 5/0017* (2013.01)

(58) Field of Classification Search
USPC ........................................ 361/807, 809, 810
See application file for complete search history.

(56) References Cited

U.S. PATENT DOCUMENTS

| 9,983,424 B2 | 5/2018 | Kim et al. |
| 2008/0055831 A1 | 3/2008 | Satoh |
| (Continued) | | |

FOREIGN PATENT DOCUMENTS

| CN | 101133434 A | 2/2008 |
| CN | 103985321 A | 8/2014 |
| (Continued) | | |

OTHER PUBLICATIONS

First Office Action dated Nov. 16, 2020 for application No. CN201910591398.3 with English translation attached.

(Continued)

*Primary Examiner* — Hung S. Bui
(74) *Attorney, Agent, or Firm* — Nath, Goldberg & Meyer; Joshua B. Goldberg

(57) ABSTRACT

The disclosure provides a back film structure, a method for manufacturing the back film structure, a display panel and a display device. The back film structure is divided into a bending region and a non-bending region. The back film structure includes a thin film layer and a barrier structure on a side of the thin film layer. An orthographic projection of the barrier structure on the thin film layer at least overlaps (Continued)

an orthographic projection of a boundary line between the bending region and the non-bending region on the thin film layer.

12 Claims, 6 Drawing Sheets

(56) References Cited

U.S. PATENT DOCUMENTS

| | | | | |
|---|---|---|---|---|
| 2016/0087229 | A1* | 3/2016 | Jeong | H01L 51/0096 257/40 |
| 2017/0317301 | A1* | 11/2017 | Xie | H01L 27/12 |
| 2018/0175310 | A1 | 6/2018 | Lee et al. | |
| 2021/0336234 | A1* | 10/2021 | Zheng | H01L 27/3258 |

FOREIGN PATENT DOCUMENTS

| | | | |
|---|---|---|---|
| CN | 104680939 | A | 6/2015 |
| CN | 104716148 | A | 6/2015 |
| CN | 206076240 | U | 4/2017 |
| CN | 107610598 | A | 1/2018 |
| CN | 108074939 | A | 5/2018 |
| CN | 108155218 | A | 6/2018 |
| CN | 108230910 | A | 6/2018 |
| CN | 108346377 | A | 7/2018 |
| CN | 108987426 | A | 12/2018 |
| CN | 109285463 | A | 1/2019 |
| CN | 109378330 | A | 2/2019 |
| CN | 109411621 | A | 3/2019 |
| CN | 109473045 | A | 3/2019 |
| CN | 109560088 | * | 4/2019 ............. H01L 27/12 |
| CN | 109671353 | A | 4/2019 |
| CN | 208737797 | U | 4/2019 |
| CN | 109830184 | A | 5/2019 |
| CN | 109830510 | A | 5/2019 |
| CN | 110264888 | A | 9/2019 |

OTHER PUBLICATIONS

Third Office Action dated Apr. 18, 2022 for application No. CN201910591398.3 with English translation attached.

* cited by examiner

BACK FILM STRUCTURE, MANUFACTURING METHOD THEREOF, DISPLAY PANEL AND DISPLAY DEVICE

CROSS-REFERENCE TO RELATED APPLICATIONS

This is a National Phase Application filed under 35 U.S.C. 371 as a national stage of PCT/CN2020/097961, filed Jun. 24, 2020, an application claiming the benefit of Chinese Patent Application No. 201910591398.3, filed on Jul. 2, 2019, the contents of each of which are incorporated herein by reference in its entirety.

TECHNICAL FIELD

The disclosure relates to the field of display technologies, and in particular, to a back film structure, a manufacturing method thereof, a display panel and a display device.

BACKGROUND

The existing folding display devices adhere various film layers (e.g., a back film structure and a display layer) together with an adhesive layer. The back film structure may protect the display layer, the display layer may display images, and adhesive of the adhesive layer generally contains a single material.

SUMMARY

As an aspect, a back film structure is provided. The back film structure is divided into a bending region and a non-bending region. The back film structure includes a thin film layer and a barrier structure on a side of the thin film layer. An orthographic projection of the barrier structure on the thin film layer at least overlaps an orthographic projection of a boundary line between the bending region and the non-bending region on the thin film layer.

In an embodiment, an extending direction of the boundary line between the bending region and the non-bending region is a first direction, and a direction perpendicular to a plane where the thin film layer is located is a second direction. The barrier structure includes a plurality of sub-barrier structures. The plurality of sub-barrier structures are uniformly distributed and spaced apart from each other. Each of the plurality of sub-barrier structures extends in the first direction.

In an embodiment, the plurality of sub-barrier structures are a plurality of protrusions, and each of the plurality of protrusions has a rectangular shape, a triangular shape, or an arc shape in a cross-sectional view.

In an embodiment, a protruding portion of the thin film layer along the second direction serves as the protrusion.

In an embodiment, the back film structure further includes an elastic structure in a shape of a sphere or cylinder filled between any two adjacent protrusions. A diameter of the sphere or a diameter of a bottom surface of the cylinder is greater than a height of the protrusion along the second direction. The elastic structure includes rubber.

In an embodiment, the plurality of sub-barrier structures are a plurality of grooves. The plurality of grooves are in the thin film layer, and each of the plurality of grooves has a rectangular, a triangular or an arc shape in a cross-sectional view.

In an embodiment, the back film structure further includes an elastic structure in a shape of a sphere or cylinder filled between any two adjacent grooves. A diameter of the sphere or a diameter of a bottom surface of the cylinder is greater than a depth of the groove. The elastic structure includes rubber.

As another aspect, a display panel is provided. The display panel includes: the back film structure described above, an adhesive layer on a side of the back film structure and covering the back film structure and the barrier structure on the back film structure, and a display layer on a side of the adhesive layer away from the back film structure.

In an embodiment, the display panel is a flexible display panel.

As yet another aspect, a display device including the display panel described above is provided.

As yet another aspect, a method for manufacturing a back film structure is provided. The back film structure is divided into a bending region and a non-bending region. The method includes: providing a thin film layer; and forming a barrier structure on a side of the thin film layer. An orthographic projection of the barrier structure on the thin film layer at least overlaps an orthographic projection of a boundary line between the bending region and the non-bending region on the thin film layer.

In an embodiment, an extension direction of the boundary line between the bending region and the non-bending region is a first direction, and a direction perpendicular to a plane where the thin film layer is located is a second direction. Forming the barrier structure on a side of the thin film layer includes: forming the barrier structure including a plurality of sub-barrier structures, such that the plurality of sub-barrier structures are uniformly distributed and spaced apart from each other, and each of the plurality of sub-barrier structures extends along the first direction.

In an embodiment, forming the barrier structure on a side of the thin film layer further includes forming a plurality of protrusions on the side of the thin film layer, each of the plurality of protrusions having a rectangular, a triangular, or an arc shape in a cross-sectional view.

In an embodiment, the thin film layer and the plurality of protrusions are formed as one piece.

In an embodiment, the method further includes forming an elastic structure in a shape of a sphere or a cylinder between any two adjacent protrusions, such that a diameter of the sphere or a diameter of a bottom surface of the cylinder is greater than a height of the protrusion along the second direction. The elastic structure is made of rubber.

In an embodiment, forming the barrier structure on a side of the thin film layer further includes forming a plurality of grooves in the thin film layer, each of the plurality of grooves having a rectangle, a triangle, or an arc shape in a cross-sectional view.

In an embodiment, the method further includes forming an elastic structure in a shape of a sphere or cylinder between any two adjacent grooves, such that a diameter of the sphere or a diameter of a bottom surface of the cylinder is greater than a depth of the groove. The elastic structure is made of rubber.

DETAILED DESCRIPTION

In order to make those skilled in the art better understand the technical solutions of the present disclosure, the present disclosure is further described in detail below with reference to the accompanying drawings and specific embodiments.

The display layer and back film structure can be bent simultaneously when being folded. However, in the related art, since the adhesive of the adhesive layer is generally made of a single material, it is easy to accumulate adhesive at a boundary line or dividing line between a bending region and a non-bending region during folding of the display layer and back film structure, thereby affecting a wiring of the display layer, and in turn affecting the display effect. Therefore, embodiments of the present disclosure provide a back film structure, a display panel and a display device. The structure and principle of the back film structure, the display panel and the display device provided by the embodiments of the present disclosure will be described in detail below with reference to the accompanying drawings.

Figure 1:
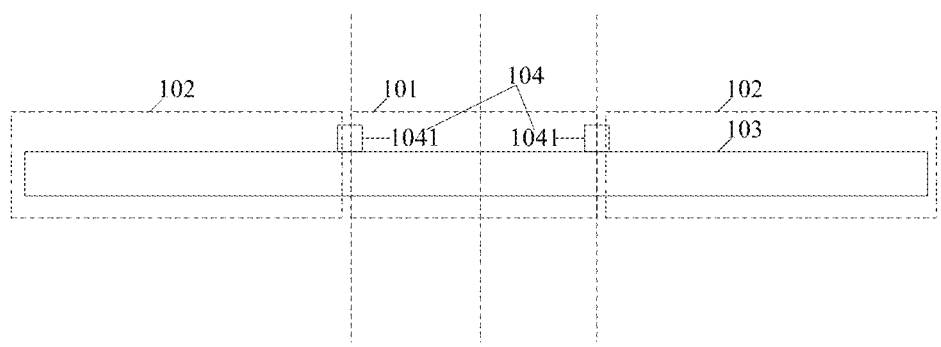
FIG. 1 is a side view showing a back film structure according to an embodiment of the present disclosure.

An embodiment of the present disclosure provides a back film structure. FIG. 1 is a side view showing a back film structure according to an embodiment of the present disclosure. As shown in FIG. 1, the back film structure is divided into a bending region 101 and a non-bending region 102. The back film structure includes a thin film layer 103, and a barrier structure 104 disposed on a side of the thin film layer 103 and at least at a boundary line between the bending region 101 and the non-bending region 102. An orthographic projection of the barrier structure 104 on the thin film layer 103 at least overlaps an orthographic projection of the boundary line between the bending region 101 and the non-bending region 102 on the thin film layer 103.

Figure 2:
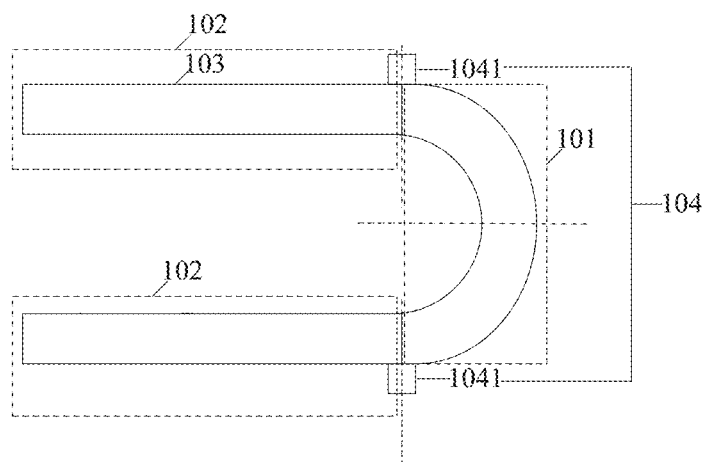
FIG. 2 is a side view showing a bent back film structure according to an embodiment of the disclosure.

FIG. 2 is a side view showing a bent back film structure according to an embodiment of the disclosure. FIG. 2 shows the folded state of the back film structure shown in FIG. 1. During folding of the back film structure, since the adhesive in the bending region 101 is mainly subjected to compressive stress and the adhesive in the non-bending region 102 is mainly subjected to shear stress, the adhesive in the bending region 101 flows toward the non-bending region 102 due to the stress generated by folding. As can be seen from FIG. 2, in the back film structure according to the embodiment of the disclosure, the barrier structure 104 formed at the boundary line between the bending region 101 and the non-bending region 102 can block the flow of the adhesive, so that the density of the adhesive in the bending region 101 increases due to the compressive stress, and the adhesive in the bending region 101 does not flow toward the non-bending region 102, thereby preventing the adhesive from accumulating at the boundary line between the bending region 101 and the non-bending region 102 due to the flow of adhesive, and avoiding poor display caused by the concave display layer.

Figure 3:
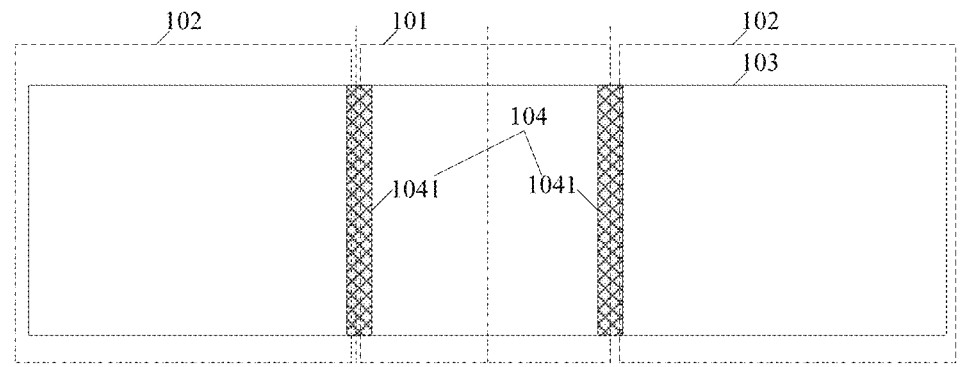
FIG. 3 is a top view showing a back film structure according to an embodiment of the present disclosure.

FIG. 3 is a top view showing a back film structure according to an embodiment of the disclosure. As shown in FIG. 3, the barrier structure 104 includes a plurality of sub-barrier structures 1041. The plurality of sub-barrier structures 1041 are arranged at intervals, and each of the sub-barrier structures 1041 extends along the boundary line between the bending region 101 and the non-bending region 102. An orthographic projection of the sub-barrier structure 1041 on the thin film layer 103 completely overlaps the orthographic projection of the boundary line between the bending region 101 and the non-bending region 102 on the thin film layer 103.

It should be noted that, each of the sub-barrier structures 1041 is formed throughout the back film structure along an extension direction parallel to the boundary line between the bending region 101 and the non-bending region 102 in the embodiment. In an embodiment, the sub-barrier structures 1041 are uniformly distributed and spaced apart from each other. Therefore, the adhesive of the adhesive layer in the bending region 101 can be uniformly distributed in the space defined by the sub-barrier structures 1041, thereby effectively preventing the adhesive from cumulating at the boundary line between the bending region 101 and the non-bending region 102 during folding of the back film structure.

Embodiments in which the sub-barrier structure 1041 is a protrusion or groove will be illustrated below.

Figure 4:
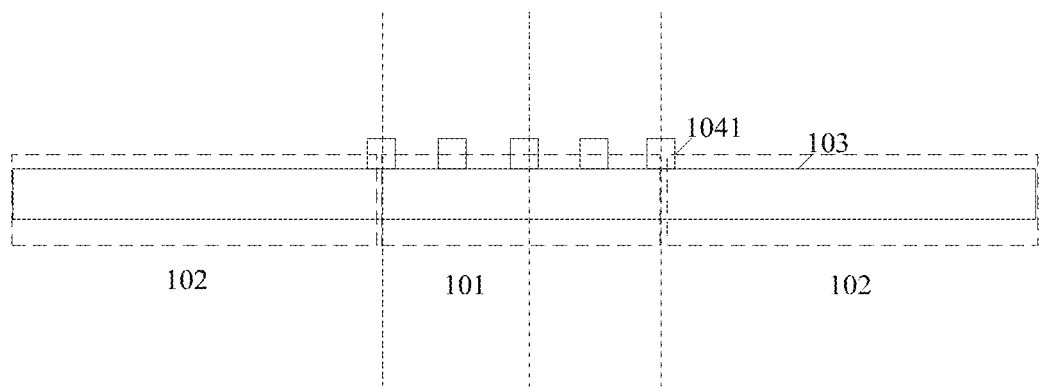
FIGS. 4 to 16 are side views showing a back film structure according to an embodiment of the present disclosure.
Figure 5:
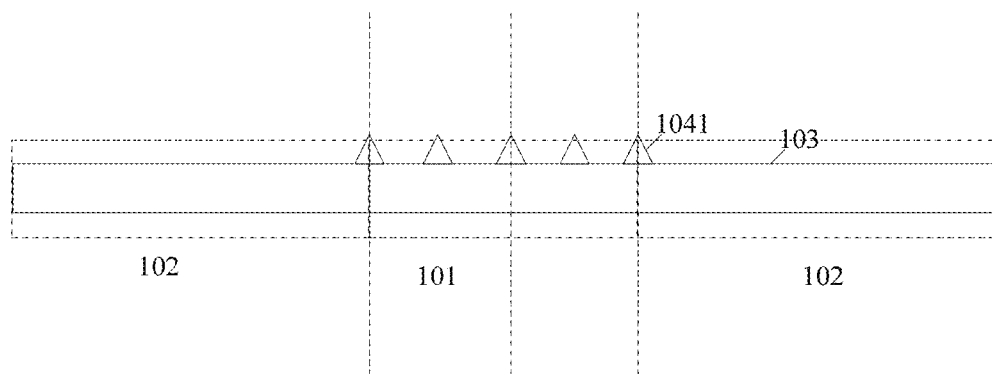
Figure 6:
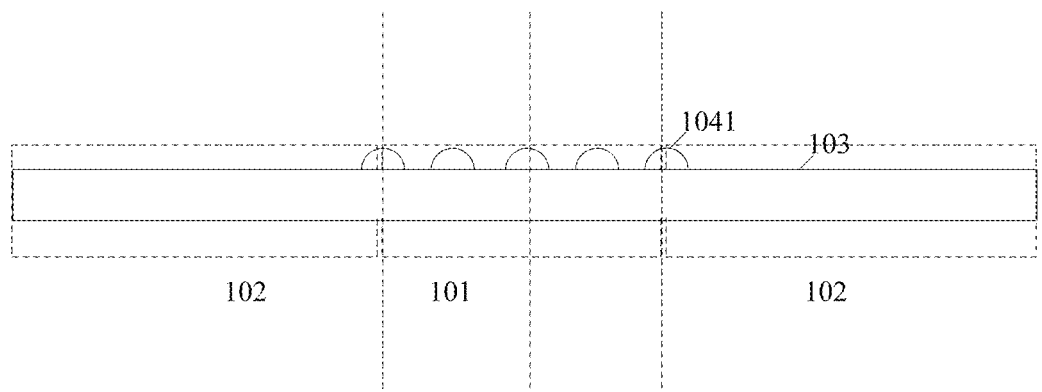

In an embodiment, each of the sub-barrier structures 1041 of the barrier structure 104 is a protrusion, as shown in FIGS. 4, 5 and 6. The thin film layer 103 is formed with the protrusions thereon as the sub-barrier structures 1041. In an embodiment, the protrusions and the thin film layer 103 are integrally formed. In an embodiment, the protrusions may be separately formed on the thin film layer 103.

The protrusion may have a rectangular shape (as shown in FIG. 4), a triangular shape (as shown in FIG. 5), or an arc shape (as shown in FIG. 6), or the like, and other shapes of the protrusion can be employed and will not be list herein. Since the protrusions are uniformly distributed and spaced apart from each other, the adhesive of the adhesive layer can be uniformly distributed in a space defined by any two adjacent protrusions of the plurality of protrusions. The protrusions at two ends of the bending region 101 can block the adhesive from flowing from the bending region 101 to the non-bending region 102 during folding of the back film structure, thereby preventing the adhesive from piling up at the boundary line between the bending region 101 and the non-bending region 102. Meanwhile, since the protrusions are located in the bending region 101, the adhesive can be coated on the protrusions and a small amount of adhesive can be coated at the space between two adjacent protrusions during a coating process of the back film structure, thereby preventing the adhesive from piling up at the boundary line between the bending region 101 and the non-bending region 102.

The protrusions may be formed by patterning the thin film layer 103 corresponding to the bending region 101 through laser ablation, roller grinding, cutter punching, mold pressing or the like. Therefore, the protrusions and the thin film layer 103 may be formed as a one-piece structure. The process for manufacturing the integrally formed structure is simple, and the cost is saved.

Figure 7:
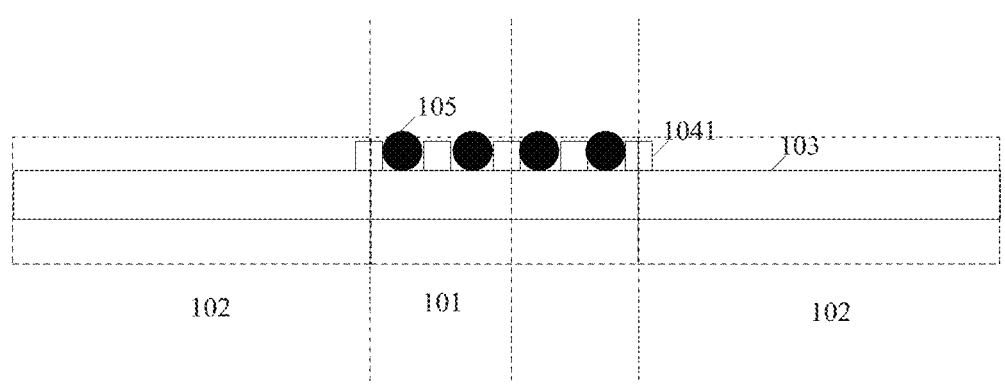
Figure 8:
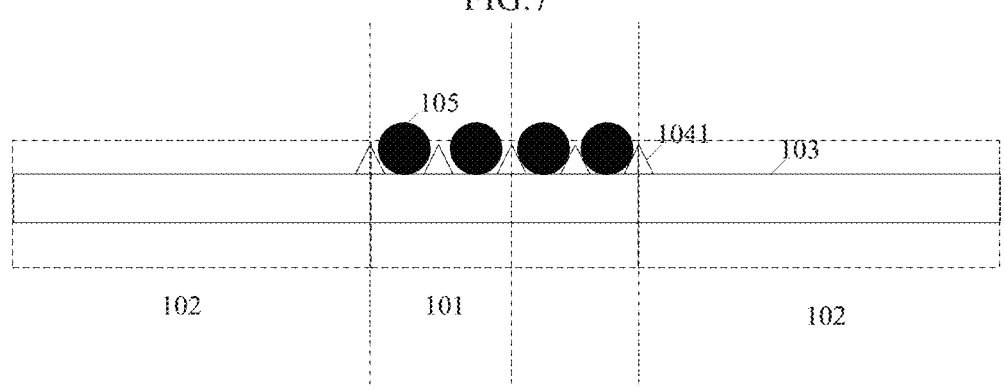
Figure 9:
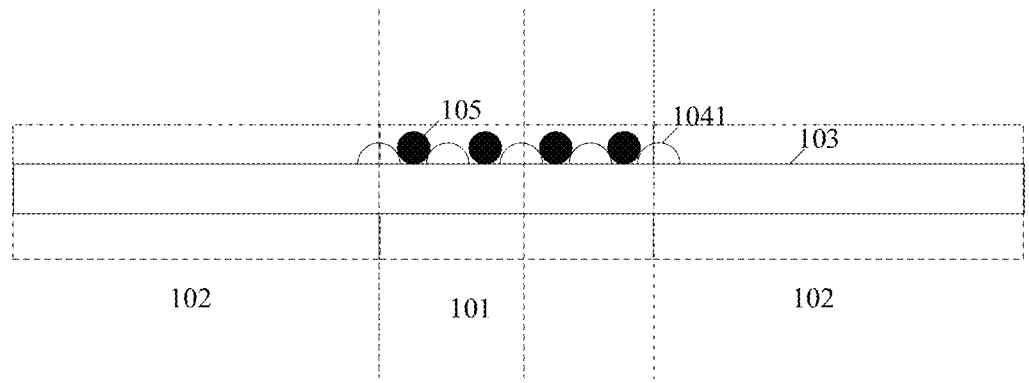

Further, an elastic structure 105 is disposed between adjacent protrusions. As shown in FIGS. 7, 8 and 9, the elastic structure 105 may be filled or located between any two adjacent protrusions of the plurality of protrusions, and may have a spherical or cylindrical shape or other shapes. When the elastic structure 105 has the spherical or cylindrical shape, the elastic structure 105 can be filled between the protrusions better. In addition, since the sphere or cylinder has a uniform surface, a uniform compressive stress is applied to the elastic structure 105 during the folding process, so that the elastic structure 105 may have a uniform compressive deformation, thereby avoiding the influence on the flatness of other film layers.

It should be understood that a thickness of the elastic structure 105 may be greater than a thickness or height of the protrusion, so as to block the adhesive from flowing from the bending region 101 to the non-bending region 102, and to avoid the accumulation of the adhesive. An extension direction of the sub-barrier structures 1041 is a first direction, and a direction intersecting the first direction and perpendicular to a plane where the thin film layer 103 is located is a second direction. A height of the elastic structure 105 along the second direction may be greater than a height of the protrusion along the second direction. The combination of the shape of the protrusion and the shape of the elastic structure 105 is not limited to the embodiment as shown in FIGS. 7, 8 and 9, and other combinations thereof can be employed and will not be listed herein.

In an embodiment, the material of the elastic structure 105 may be rubber.

Since the rubber material of the elastic structure 105 has a better resilience than the adhesive, the resilience of the back film structure can be increased. Further, since the hardness of the rubber is greater than the hardness of the adhesive, the bending force for bending the thin film structure 104 can be increased. In the case where the elastic structure 105 is formed of rubber, a soft adhesive may be used. Usage of the soft adhesive may also increase the resilience of the back film structure and may be beneficial to improving the folding performance of the back film structure.

Figure 10:
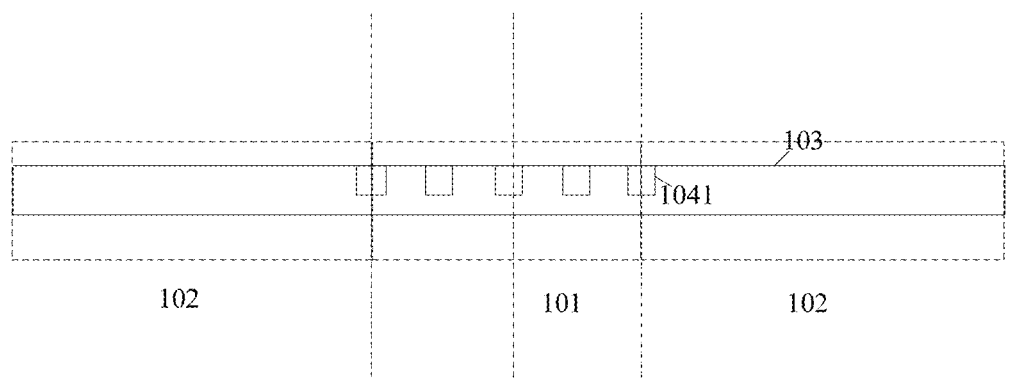
Figure 11:
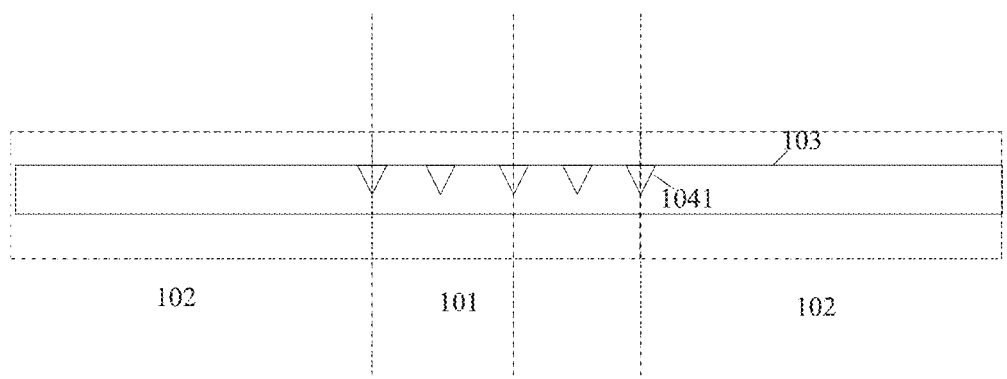
Figure 12:
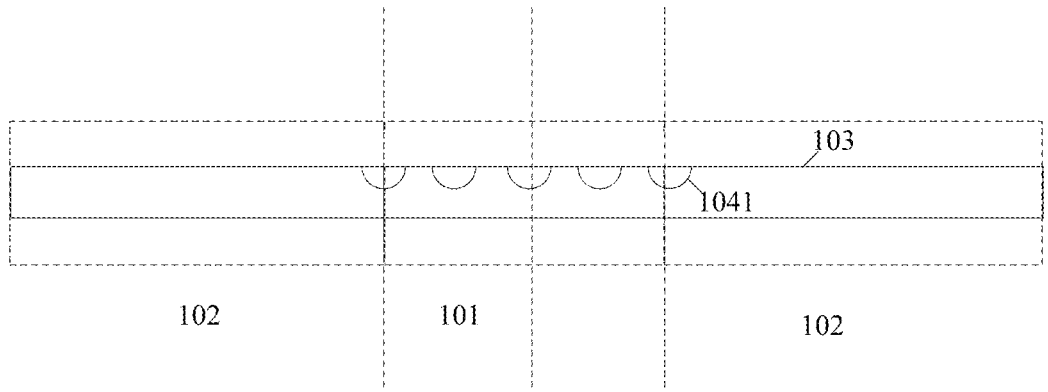

In another embodiment, each of the sub-barrier structures 1041 of the barrier structure 104 is a groove, as shown in FIGS. 10, 11 and 12. A groove is formed in the thin film layer 103 as the sub-barrier structure 1041.

The groove may have a rectangular shape (as shown in FIG. 10), triangular shape (as shown in FIG. 11), or arc shape (as shown in FIG. 12), and other shapes thereof can be employed and will not be listed herein. A plurality of grooves are arranged at even intervals, and each of the grooves extends along the first direction. The adhesive of the adhesive layer can be uniformly distributed in spaces defined by the grooves. The groove can block the adhesive from flowing from the bending region 101 to the non-bending region 102 during folding the back film structure, so as to avoid the accumulation of the adhesive.

The grooves can be formed by patterning the thin film layer 103 corresponding to the bending region 101 through laser ablation, roller grinding, cutter punching, mold pressing or the like. Therefore, the grooves and the thin film layer 103 may be an integrally formed structure. The process for manufacturing the integrally formed structure is simple, and the cost is saved.

Figure 13:
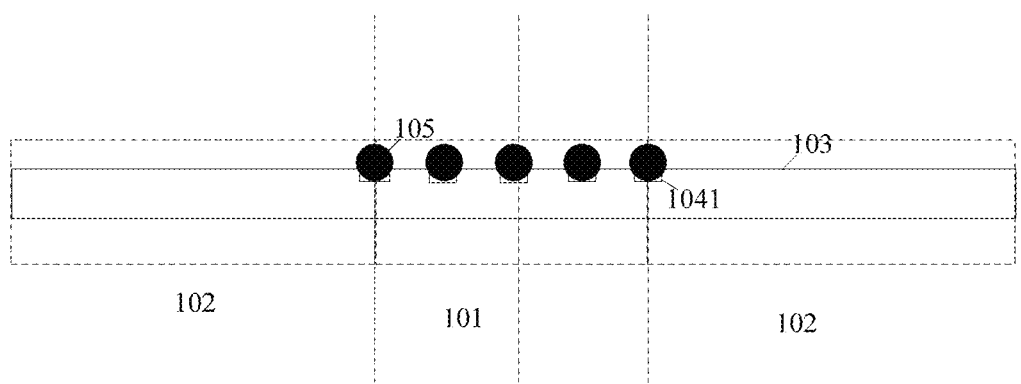
Figure 14:
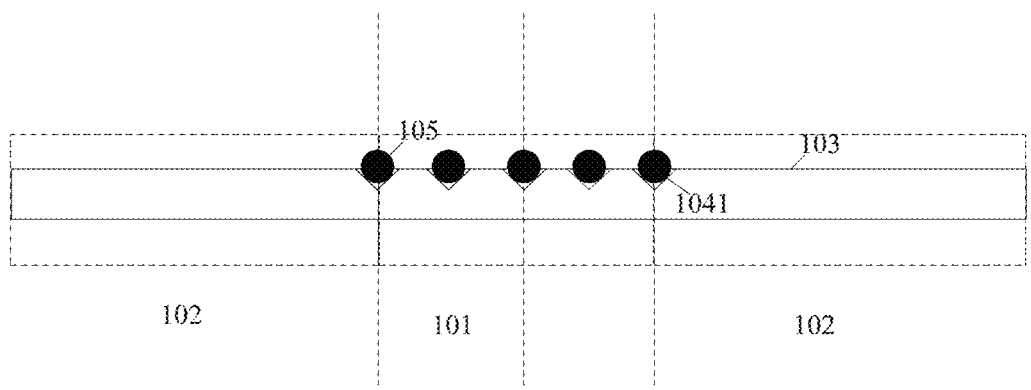
Figure 15:
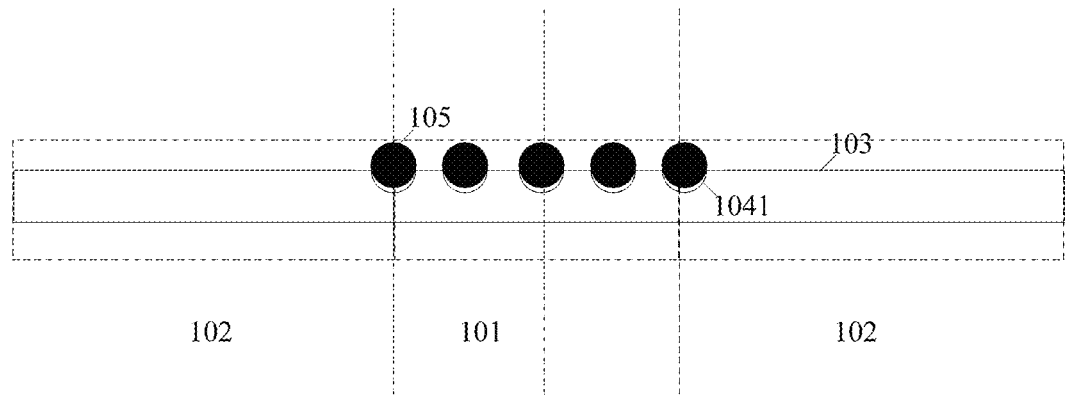

In an embodiment, elastic structures 105 are formed within the spaces defined by the grooves respectively. As shown in FIGS. 13, 14 and 15, the elastic structures 105 in a shape of a sphere or cylinder or other shapes may be filled in the spaces defined by the grooves respectively.

A thickness of the elastic structure 105 (e.g., a diameter of the sphere or a diameter of a bottom surface of the cylinder) may be greater than a thickness or depth of the groove along the second direction, so as to block the adhesive from flowing from the bending region 101 to the non-bending region 102, so that the accumulation of the adhesive can be avoided. In an embodiment, a height of the elastic structure 105 along the second direction may be greater than the depth of the groove. A combination of the shape of the groove and the shape of the elastic structure 105 is not limited to the embodiments shown in FIGS. 13, 14 and 15, and other combinations thereof may be employed and will not be listed herein.

It is understood that the sub-barrier structure 1041 may have other shapes being capable of blocking other than the above protrusion or groove, and the shape of the sub-barrier structure 1041 is not limited herein.

In an embodiment, as shown in FIG. 1, the barrier structure 104 of the back film structure may include only two sub-barrier structures 1041 each located at the boundary line between the bending region 101 and the non-bending region 102. The sub-barrier structure 1041 includes a protrusion.

Since the barrier structure 104 only includes the protrusions each located at the boundary line between the bending region 101 and the non-bending region 102, the barrier structure 104 can block the adhesive from flowing from the bending region 101 to the non-bending region 102, so as to avoid the accumulation of the adhesive at the boundary line between the bending region 101 and the non-bending region 102.

Figure 16:
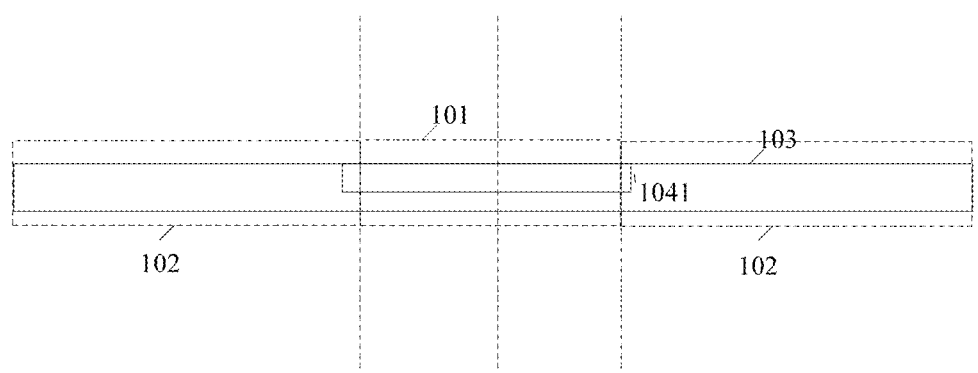

In another embodiment, as shown in FIG. 16, the barrier structure 104 of the back film structure may include only one sub-barrier structure 1041, and the sub-barrier structure 1041 is a groove. The groove has a large area to cover the entire bending region 101. An orthographic projection of bending region 101 on thin film layer 103 is within an orthographic projection of the groove on thin film layer 103. The groove with a large area formed at the bending region 101 can block the adhesive from flowing from the bending region 101 to the non-bending region 102 during folding of the back film structure, so as to avoid the accumulation of the adhesive at the boundary line between the bending region 101 and the non-bending region 102.

Figure 17:
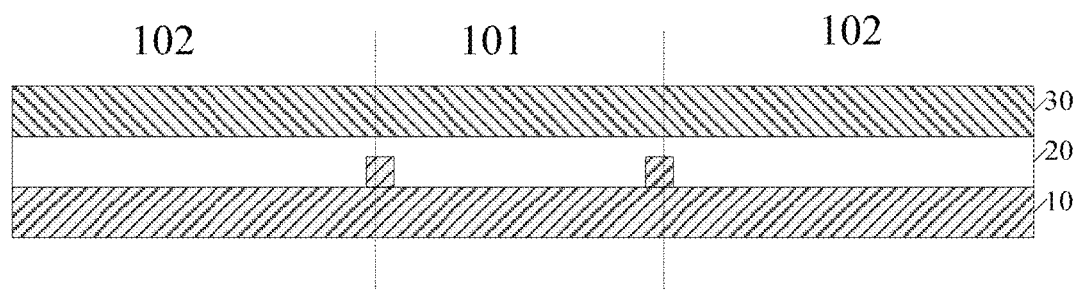
FIG. 17 is a schematic diagram showing a display panel according to an embodiment of the disclosure.

An embodiment of the present disclosure provides a display panel, and FIG. 17 is a schematic diagram showing a structure of a display panel according to an embodiment of the present disclosure. As shown in FIG. 17, the display panel includes the back film structure 10 provided in the above embodiment. The back film structure 10 is attached to a display layer 30 through an adhesive layer 20. The adhesive layer 20 is located on a side of the back film structure 10 and covers the back film structure 10 and the barrier structure 104 on the back film structure 10. The display layer 30 is located on a side of the adhesive layer 20 away from the back film structure 10.

It should be noted that the adhesive of the adhesive layer 20 flows under the action of the stress generated by folding during the folding of the back film structure, and the barrier structure of the back film structure can effectively block the adhesive of the adhesive layer 20 from flowing from the bending region to the non-bending region, so as to prevent the accumulation of the adhesive.

In an embodiment, the display panel may be a flexible display panel.

It is understood that the display panel is made of a flexible material and can be bent, deformed, folded, or the like, in practical applications, therefore the display panel may be a flexible display panel.

An embodiment of the present disclosure provides a display device, which includes the display panel provided in the above embodiment. The implementation principle of the display device provided by the embodiment of the present disclosure is similar to that of the back film structure 10 provided by the above embodiment, and will not be described herein again. The display device provided by the embodiment of the disclosure may be an electronic paper, a mobile phone, a tablet computer, a display, a notebook computer, or the like.

The display device according to the embodiment of the present disclosure may be a foldable device. It can effectively block the adhesive of the adhesive layer inside the display device from flowing from the bending region to non-bending region during folding of the display device, so as to avoid the accumulation of the adhesive and the influence on the wiring of the display layer. The display device according to the embodiment of the disclosure may be a flexible panel, and the barrier structure of the back film structure can effectively avoid the damage to the flexible display panel caused by the accumulation of the adhesive, thereby improving the use experience of a user.

An embodiment of the disclosure provides a method for manufacturing a back film structure. The back film structure is divided into a bending region and a non-bending region. The method includes: providing a thin film layer 103; and forming a barrier structure 104 on a side of the thin film layer 103. An orthographic projection of the barrier structure 104 on the thin film layer 103 at least overlaps an orthographic projection of a dividing line or boundary line between the bending region 104 and the non-bending region 102 on the thin film layer 103.

An extension direction of the boundary line between the bending region and the non-bending region is a first direction, and a direction perpendicular to a plane where the thin film layer is located is a second direction. Forming the barrier structure 104 on a side of the thin film layer 103 includes: forming the barrier structure 104 including a plurality of sub-barrier structures 1041, such that the plurality of sub-barrier structures 1041 are uniformly distributed and spaced apart from each other and each of the plurality of sub-barrier structures 1041 extends along the first direction.

Forming barrier structure 104 on a side of the thin film layer 103 further includes: forming a plurality of protrusions 1041 on a side of the thin film layer 103. Each of the plurality of protrusions has a rectangular, a triangular or an arc shape in a cross-sectional view, as shown in FIGS. 4, 5, 6. In an embodiment, the thin film layer 103 and the plurality of protrusions 1041 are formed as a unitary body.

The method further includes: forming an elastic structure 105 in a shape of a sphere or cylinder between any two adjacent protrusions 1041, such that a diameter of the sphere or a diameter of a bottom surface of the cylinder is greater than a height of the protrusion along the second direction. In an embodiment, the elastic structure 105 is made of rubber.

Forming the barrier structure 104 on a side of the thin film layer 103 further includes: forming a plurality of grooves in the thin film layer. Each of the plurality of grooves has a rectangular, a triangular or an arc shape in the cross-sectional view, as shown in FIGS. 10, 11, 12.

The method further includes: forming an elastic structure 105 in a shape of a sphere or cylinder between any two adjacent protrusions 1041, such that a diameter of the sphere or a diameter of a bottom surface of the cylinder is greater than a depth of the groove. In an embodiment, the elastic structure is made of rubber.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and spirit of the present disclosure, which are also to be regarded as the scope of the present disclosure.

What is claimed is:

1. A back film structure having a bending region and a non-bending region and comprising a thin film layer, wherein
   the back film structure further comprises a barrier structure on a side of the thin film layer, and
   an orthographic projection of the barrier structure on the thin film layer at least overlaps an orthographic projection of a boundary line between the bending region and the non-bending region on the thin film layer,
   wherein an extending direction of the boundary line between the bending region and the non-bending region is a first direction, and a direction perpendicular to a plane where the thin film layer is located is a second direction,
   the barrier structure comprises a plurality of sub-barrier structures, the plurality of sub-barrier structures are uniformly distributed and spaced apart from each other, and each of the plurality of sub-barrier structures extends in the first direction,
   the plurality of sub-barrier structures are a plurality of protrusions, the back film structure further comprises an elastic structure filled between any two adjacent protrusions of the plurality of protrusions, wherein the elastic structure is in a shape of a sphere or cylinder, a diameter of the sphere or a diameter of a bottom surface of the cylinder is greater than a height of each of the plurality of protrusions along the second direction, and the elastic structure comprises rubber, or
   the plurality of sub-barrier structures are a plurality of grooves, the back film structure further comprises an elastic structure filled between any two adjacent grooves of the plurality of grooves, wherein the elastic structure is in a shape of a sphere or cylinder, a diameter of the sphere or a diameter of a bottom surface of the cylinder is greater than a depth of each of the plurality of grooves, and the elastic structure comprises rubber.

2. The back film structure of claim 1, wherein
   each of the plurality of protrusions has a rectangular shape, a triangular shape, or an arc shape in a cross-sectional view.

3. The back film structure of claim 2, wherein
   a protruding portion of the thin film layer along the second direction serves as a protrusion of the plurality of protrusions.

4. The back film structure of claim 1, wherein
   the plurality of grooves are in the thin film layer, and
   each of the plurality of grooves has a rectangular, a triangular or an arc shape in a cross-sectional view.

5. A display panel, comprising:
   the back film structure of claim 1;
   an adhesive layer on a side of the back film structure and covering the back film structure and the barrier structure on the back film structure, and
   a display layer on a side of the adhesive layer away from the back film structure.

6. The display panel of claim 5, wherein the display panel is a flexible display panel.

7. A display device, comprising the display panel of claim 6.

8. A display device, comprising the display panel of claim 5.

9. A method for manufacturing a back film structure, the back film structure having a bending region and a non-bending region, the method comprising:
  providing a thin film layer; and
  forming a barrier structure on a side of the thin film layer, wherein
  an orthographic projection of the barrier structure on the thin film layer at least overlaps an orthographic projection of a boundary line between the bending region and the non-bending region on the thin film layer,
  an extension direction of the boundary line between the bending region and the non-bending region is a first direction, and a direction perpendicular to a plane where the thin film layer is located is a second direction,
  forming the barrier structure on a side of the thin film layer comprises: forming the barrier structure comprising a plurality of sub-barrier structures, such that the plurality of sub-barrier structures are uniformly distributed and spaced apart from each other, and each of the plurality of sub-barrier structures extends along the first direction,
  the plurality of sub-barrier structures are a plurality of protrusions on the thin film layer, and the method further comprises: forming an elastic structure in a shape of a sphere or a cylinder between any two adjacent protrusions of the plurality of protrusions, such that a diameter of the sphere or a diameter of a bottom surface of the cylinder is greater than a height of each of the plurality of protrusions along the second direction, wherein the elastic structure is made of rubber, or
  the plurality of sub-barrier structures are a plurality of grooves in the thin film layer, and the method further comprises: forming an elastic structure in a shape of a sphere or cylinder between any two adjacent grooves of the plurality of protrusions, such that a diameter of the sphere or a diameter of a bottom surface of the cylinder is greater than a depth of each of the plurality of grooves, wherein the elastic structure is made of rubber.

10. The method of claim 9, wherein
each of the plurality of protrusions having a rectangular, a triangular, or an arc shape in a cross-sectional view.

11. The method of claim 10, wherein
the thin film layer and the plurality of protrusions are formed as an integral structure.

12. The method of claim 9, wherein
each of the plurality of grooves having a rectangle, a triangle, or an arc shape in a cross-sectional view.

* * * * *